(12) United States Patent
Cohen

(10) Patent No.: US 7,626,420 B1
(45) Date of Patent: Dec. 1, 2009

(54) METHOD, APPARATUS, AND SYSTEM FOR SYNCHRONOUSLY RESETTING LOGIC CIRCUITS

(75) Inventor: Elik E. Cohen, Fremont, CA (US)

(73) Assignee: NVIDIA Corporation, Santa Clara, CA (US)

( * ) Notice: Subject to any disclaimer, the term of this patent is extended or adjusted under 35 U.S.C. 154(b) by 221 days.

(21) Appl. No.: 11/229,280

(22) Filed: Sep. 16, 2005

(51) Int. Cl.
*H03K 19/173* (2006.01)
*H03K 19/00* (2006.01)
*H03K 19/096* (2006.01)

(52) U.S. Cl. .................... 326/46; 326/93; 326/94; 326/95; 326/96; 326/97; 326/98; 326/37; 326/38

(58) Field of Classification Search ............ 326/93
See application file for complete search history.

(56) References Cited

U.S. PATENT DOCUMENTS

| 5,331,669 A * | 7/1994 | Wang et al. ............ 375/371 |
| 5,646,553 A * | 7/1997 | Mitchell et al. .......... 326/86 |
| 6,586,969 B1 * | 7/2003 | Koe ......................... 326/93 |
| 7,026,849 B2 * | 4/2006 | Ichikawa ................ 327/142 |
| 2005/0036577 A1 * | 2/2005 | Sweet .................... 375/354 |

* cited by examiner

*Primary Examiner*—Vibol Tan
*Assistant Examiner*—Matthew C Tabler
(74) *Attorney, Agent, or Firm*—Cooley Godward Kronish LLP

(57) ABSTRACT

An apparatus, system, and method are described for synchronously resetting logic circuits. A synchronous reset signal is coupled to at least one asynchronous reset input for synchronously resetting sequential logic. In one embodiment, reset logic generates a signal coupled to the at least one asynchronous reset input of the sequential logic to synchronously reset the sequential logic.

6 Claims, 8 Drawing Sheets

METHOD, APPARATUS, AND SYSTEM FOR SYNCHRONOUSLY RESETTING LOGIC CIRCUITS

FIELD OF THE INVENTION

The present invention relates generally to the design and synthesis of integrated circuits. More particularly, this invention relates to optimizing the resetting of synchronous logic circuits to save area and power, and to aid in timing closure.

BACKGROUND OF THE INVENTION

Traditionally, logic circuits have been synchronous, and have combined combinatorial logic and sequential logic. Combinatorial logic, such as adders or multiplexers, is used to derive the new state and the outputs of the logic based on inputs to the logic and on the current state of the logic. This current state is obtained from sequential logic, which has output dependent on both its internal state as well as its current inputs. Examples of sequential logic are memory components such as flip-flops (flops) or registers, which contain many flops. The new current state derived by the combinatorial logic is copied to the sequential logic, typically on every rising edge of the clock signal available to the circuit.

Synchronous logic circuits can typically be reset, or cleared, both asynchronously and synchronously. An asynchronous reset is typically activated and cleared externally. When activated, the asynchronous reset immediately resets sequential logic. A synchronous reset is generated internally by combinatorial logic, and resets sequential logic, typically on a subsequent rising clock edge. Since the synchronous reset allows the full clock period for circuit operation, the synchronous reset simplifies circuit design, timing closure, and testing.

FIG. 1 illustrates a logical block diagram of a prior art system 150 with synchronous and asynchronous reset functions. Input data 100 is processed by processing logic 120, typically consisting of combinatorial logic, generating output data 108. The processing logic 120 stores state information in sequential logic 124 via logic input signal 110, and obtains state information from the sequential logic 124 via logic output signal 112. A reset module 140 receives an input control signal 118 from the processing logic 120 and an external input asynchronous reset signal 102. Based on the input control signal 118, synchronous reset initiation logic 122 within the reset module 140, typically consisting of combinatorial logic and sequential logic, determines when to reset the sequential logic 124 via a synchronous reset signal 114. The synchronous reset signal 114 is applied to synchronous reset input 132 of the sequential logic 124. The synchronous reset of the sequential logic 124 is typically on the rising edge of a clock input 106 to the system 150. Based on the input asynchronous reset signal 102, reset logic 126 within the reset module 140 resets the sequential logic 124 and the synchronous reset initiation logic 122 via an asynchronous reset signal 116. The asynchronous reset signal 116 is applied to asynchronous reset input 130 of the sequential logic 124. The sequential logic 124 is therefore typically reset both asynchronously and synchronously, while the reset logic 126 and the synchronous reset initiation logic 122 are typically reset only asynchronously. The reset logic 126 also has a direct current (DC) supply voltage input 104.

FIG. 2 illustrates a schematic of an element of the sequential logic 124 that can be synchronously and asynchronously reset, in accordance with prior art. The synchronous reset signal 114, which is active low, is applied to the synchronous reset input 132 on mux (multiplexer) 204, and controls which of the logic input signal 110 or ground 202 is selected as output 200 of mux 204. Flop 210 sees mux output 200 on its D-pin 212, the clock input 106 on its clock pin 214, and the asynchronous reset signal 116, which is active low, on its C-pin 216. The asynchronous reset signal 116 is applied to the asynchronous reset input 130 of the flop 210. The logic output signal 112 of the sequential logic 124 is on Q-pin 218 of the flop 210. The mux 204 is typically used to enable the synchronous reset of the flop 210 via the D-pin 212, since the flop 210 typically has no pin dedicated for synchronous reset. Additional logic beyond the flop 210, such as the mux 204, is therefore typically required to enable both synchronous and asynchronous reset of the sequential logic 124.

FIG. 3 illustrates a schematic of the reset logic 126 enabling the asynchronous activation and the synchronous release of the asynchronous reset signal 116, in accordance with prior art. The asynchronous reset signal 116 is connected to the asynchronous reset input 130 of the sequential logic 124. Flop 310 sees the DC supply voltage input 104 on its D-pin (data input pin) 312, the clock input 106 on its clock pin 314, and the input asynchronous reset signal 102, which is active low, on its C-pin (clear pin, typically for asynchronous reset) 316. Flop output signal 300 of the flop 310 is on its Q-pin (data output pin) 318. Flop 320 sees the flop output signal 300 of the flop 310 on its D-pin 322, the clock input 106 on its clock pin 324, and the input asynchronous reset signal 102, which is active low, on its C-pin 326. The output of the flop 320 is the asynchronous reset signal 116.

Though asynchronous activation of asynchronous reset is essentially immediate, it is important for the release of asynchronous reset to be synchronous, typically on a rising clock edge. The reset logic 126 shown in FIG. 3 guarantees that, upon the clearing of the input asynchronous reset signal 102, the asynchronous reset signal 116 does not clear (corresponding to passing the DC supply voltage 104 through the flop 310 and the flop 320) until the second subsequent rising edge of the clock input 106. This typically provides sufficient time for the logic in the system 150 to clear. If more time is required, additional flop states can be added to the reset logic 126.

Logic synthesis, which converts a register-transfer level (RTL) description of digital logic into a gate-level description, results in additional gates, such as multiplexers, in sequential logic elements when synchronous reset is added to circuits providing asynchronous reset. In a wireless local area network (LAN) transceiver, a large number of sequential logic elements is typically simultaneously reset upon completion of processing of an input data packet, since there is no need to maintain state information for processing of the subsequent data packet. Therefore, any gate savings obtainable across every sequential logic element can be significant in terms of area, power, and cost savings. These savings can also aid in timing closure. It would be highly desirable to provide a method, apparatus, and system for synchronously resetting logic circuits that reduces the number of additional gates for applications with many sequential logic elements, in particular by reducing the number of gates required to enable both synchronous and asynchronous reset of sequential logic.

SUMMARY OF THE INVENTION

An apparatus, system, and method are described for synchronously resetting logic circuits. A synchronous reset signal is coupled to at least one asynchronous reset input for synchronously resetting sequential logic.

One embodiment of the invention is an integrated circuit comprising: sequential logic that has at least one asynchronous reset input; and reset logic that generates a signal coupled to the at least one asynchronous reset input of the sequential logic to synchronously reset the sequential logic. The reset logic may combine the synchronous reset signal and an input asynchronous reset signal to generate an emulated asynchronous reset signal.

One embodiment of a method for resetting synchronous logic comprises: generating a synchronous reset signal; converting the synchronous reset signal into an emulated asynchronous reset signal; and resetting sequential logic by applying the emulated asynchronous reset signal to at least one asynchronous reset input of the synchronous logic.

One embodiment of a method for reducing the number of logic elements required to reset a sequential logic circuit comprises: generating a synchronous reset signal; converting the synchronous reset signal into an emulated asynchronous reset signal; and applying the emulated asynchronous reset signal to more than one sequential logic element, where each of the sequential logic elements is synchronously reset only by the emulated asynchronous reset signal so that separate logic at a data input of each of the sequential logic elements is not required for synchronous reset.

One embodiment of a system containing synchronous logic comprises: processing logic for converting input data to output data; sequential logic accessed by the processing logic and providing output to the processing logic, where this sequential logic includes at least one asynchronous reset input; and reset logic generating a signal coupled to the at least one asynchronous reset input for synchronously resetting the sequential logic.

BRIEF DESCRIPTION OF THE DRAWINGS

For a better understanding of the nature and objects of the invention, reference should be made to the following detailed description taken in conjunction with the accompanying drawings, in which.

DETAILED DESCRIPTION OF THE INVENTION

Figure 4:
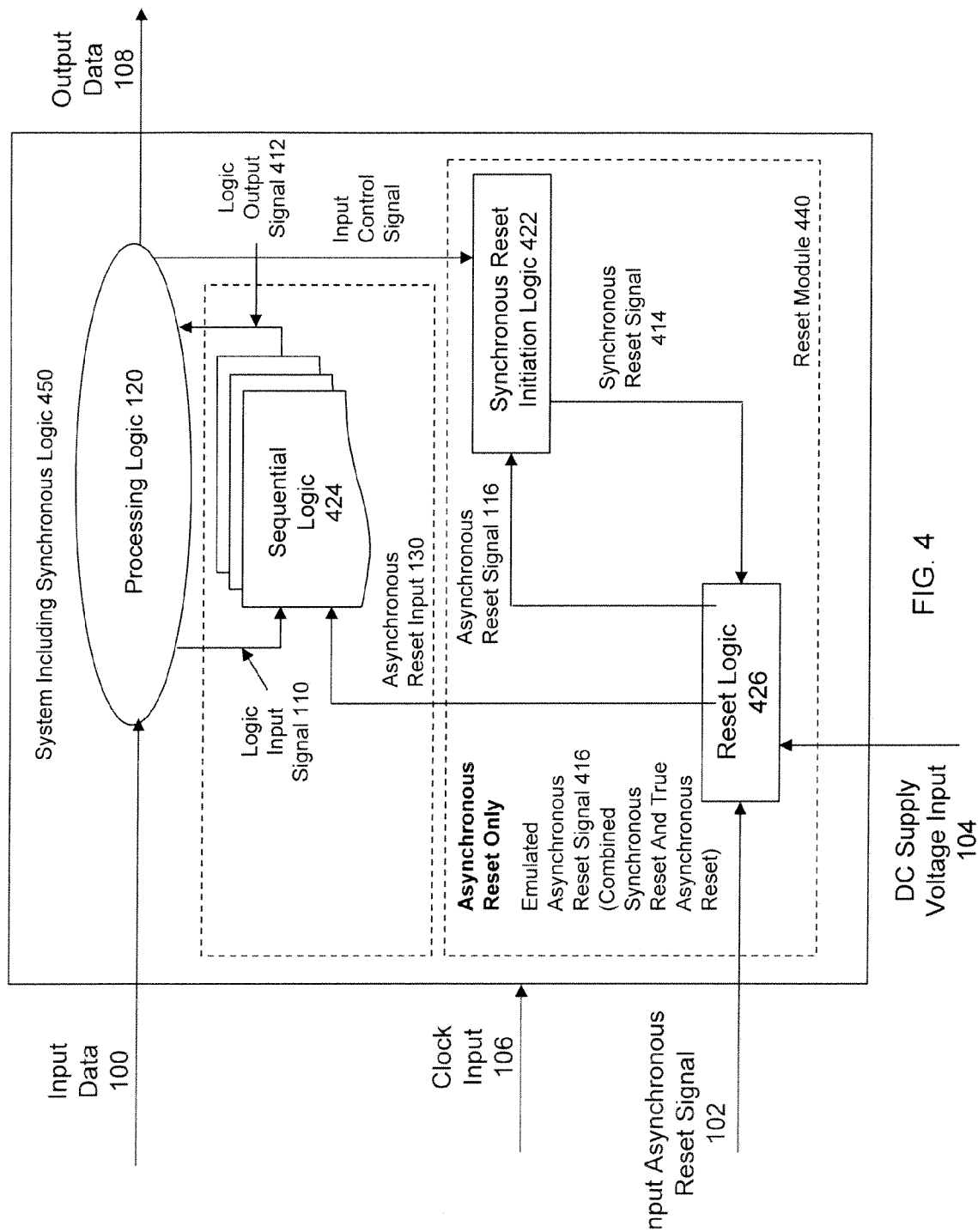
FIG. 4 illustrates a logical block diagram of a system with synchronous and asynchronous reset functions, in accordance with one embodiment of the present invention.

FIG. 4 illustrates a logical block diagram of a system 450 with synchronous and asynchronous reset functions, in accordance with one embodiment of the present invention. The input data 100 is processed by the processing logic 120, typically consisting of combinatorial logic, generating the output data 108. The processing logic 120 stores state information in sequential logic 424 via the logic input signal 110, and obtains state information from sequential logic 424 via logic output signal 412. Sequential logic 424 may comprise a single sequential logic element (not shown in FIG. 4). However, more generally sequential logic 424 comprises an integer number of individual sequential logic elements, such as individual flops configured to perform one or more sequential logic functions.

Sequential logic 424 includes at least one asynchronous reset input 130. A signal generated by a reset module 440 can be applied to the asynchronous reset input 130 to reset the sequential logic 424. The reset module 440 receives as inputs the input control signal 118 from the processing logic 120, the input asynchronous reset signal 102, and the DC supply voltage 104. As described below in more detail, in the present invention a synchronous reset signal 414 is combined with an input asynchronous reset signal 102 to create an emulated asynchronous reset signal 416 that is applied to the asynchronous reset input 130. The sequential logic 424 can be synchronously and asynchronously reset by the emulated asynchronous reset signal 416.

In one embodiment, the reset module 440 comprises synchronous reset initiation logic 422 and reset logic 426. The synchronous reset initiation logic 422 receives the input control signal 118 from the processing logic 120. Based on the input control signal 118, synchronous reset initiation logic 422, often consisting of combinatorial logic and sequential logic, generates a synchronous reset signal 414 as an input to reset logic 426. Based on the synchronous reset signal 414 and the input asynchronous reset signal 102, the reset logic 426 generates the asynchronous reset signal 116 used to reset the synchronous reset initiation logic 422, and generates the emulated asynchronous reset signal 416 used to reset the sequential logic 424. The synchronous reset signal 414 is generated internally to the system 450, while the input asynchronous reset signal 102 is an input to the system 450. The sequential logic 424 is therefore preferably reset both asynchronously and synchronously, while the reset logic 426 and the synchronous reset initiation logic 422 are preferably reset only asynchronously. The asynchronous and synchronous resets of the sequential logic 424 by the emulated asynchronous reset signal 416 both occur via the normally single, built-in reset port of the sequential logic 424. The synchronous reset of the sequential logic 424 is typically on the rising edge of a clock input 106 to the system 450.

Figure 5:
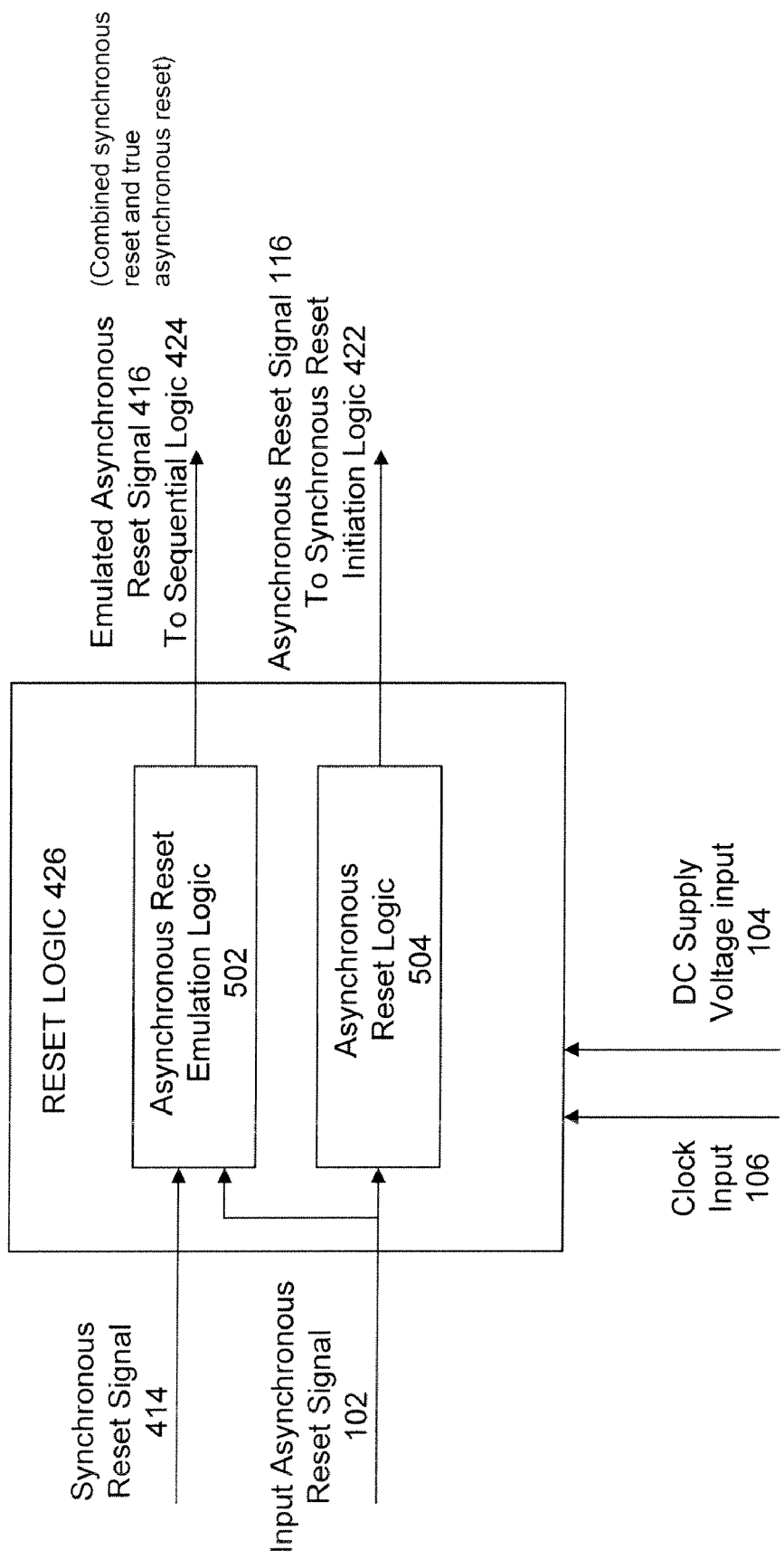
FIG. 5 illustrates a logical block diagram of a circuit enabling the generation of an emulated asynchronous reset signal to sequential logic and an asynchronous reset signal to synchronous reset initiation logic, in accordance with one embodiment of the present invention.

FIG. 5 illustrates a logical block diagram of the reset logic 426 enabling the generation of the emulated asynchronous reset signal 416 to the sequential logic 424 and the asynchronous reset signal 116 to synchronous reset initiation logic 422. Asynchronous reset logic 504 generates the asynchronous reset signal 116 based on the input asynchronous reset signal 102, the clock input 106, and the DC supply voltage input 104. Asynchronous reset emulation logic 502 generates the emulated asynchronous reset signal 416 to the sequential logic 424, based on the synchronous reset signal 414, the input asynchronous reset signal 102, the clock input 106, and the DC supply voltage input 104. The emulated asynchronous reset signal 416 combines the synchronous reset and true asynchronous reset functions, allowing gate savings in the sequential logic 424, as shown in FIG. 6.

Figure 1:
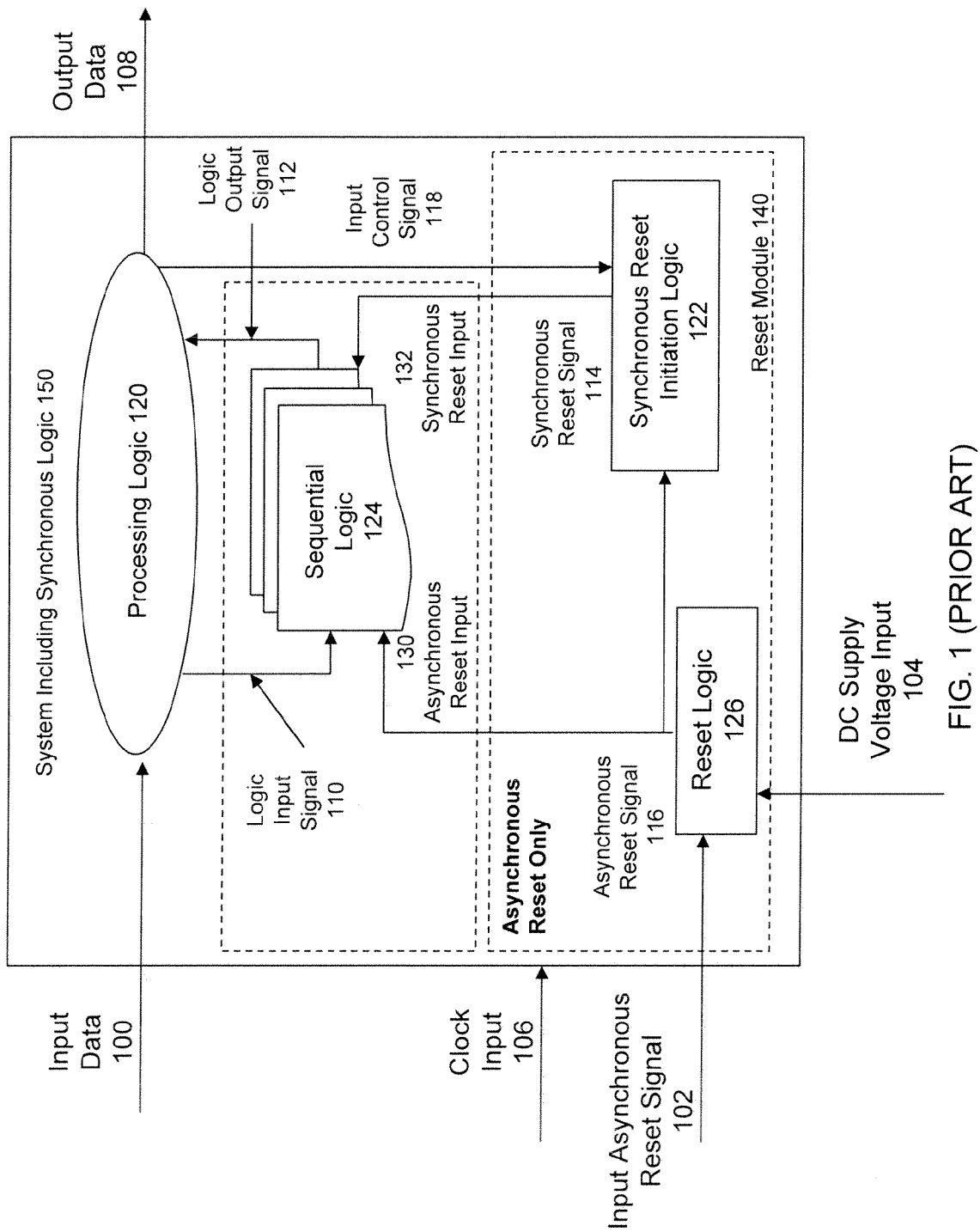
FIG. 1 illustrates a logical block diagram of a system with synchronous and asynchronous reset functions, in accordance with prior art.
Figure 2:
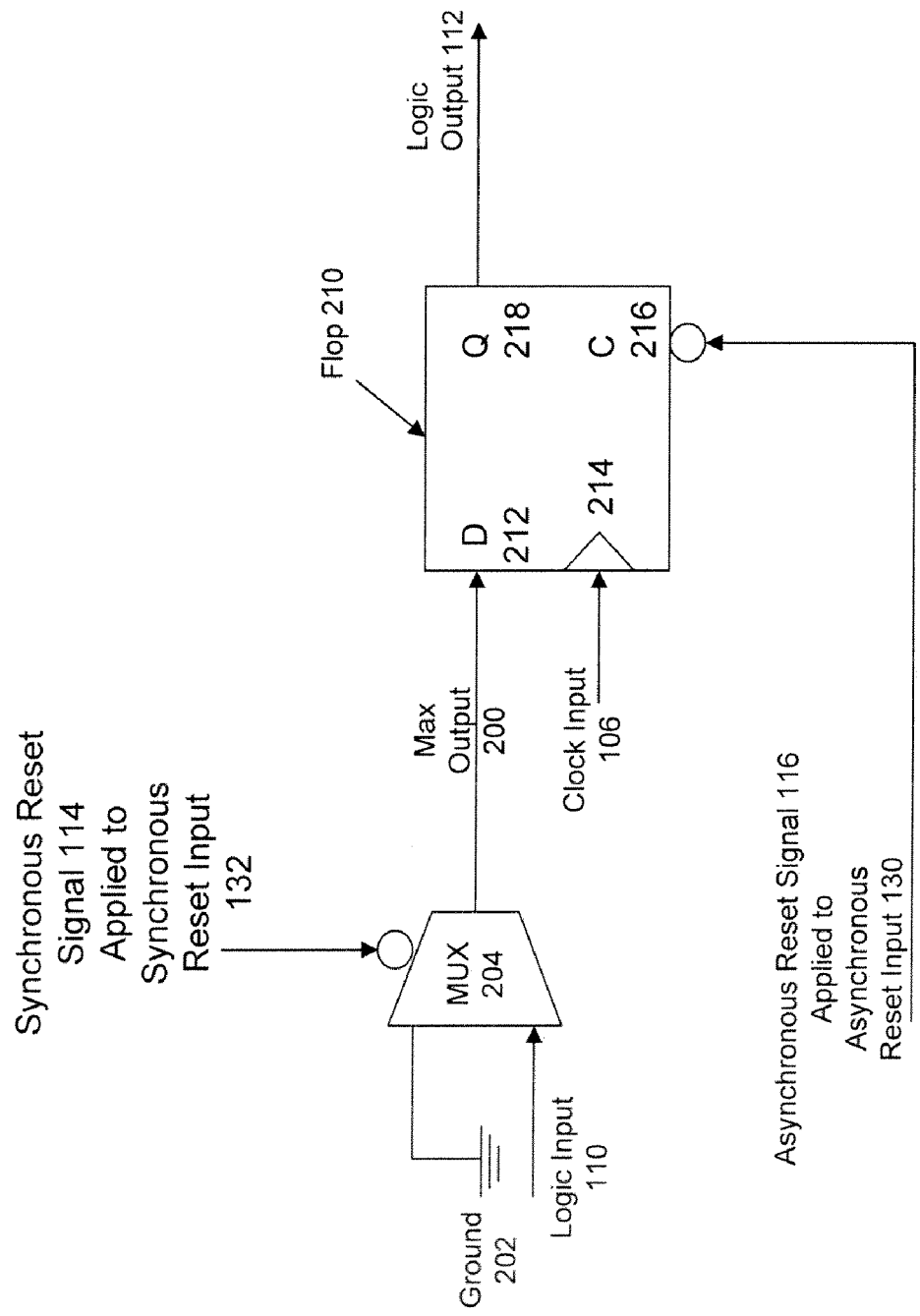
FIG. 2 illustrates a schematic of a circuit enabling synchronous and asynchronous reset of a sequential logic element, in accordance with prior art.
Figure 3:
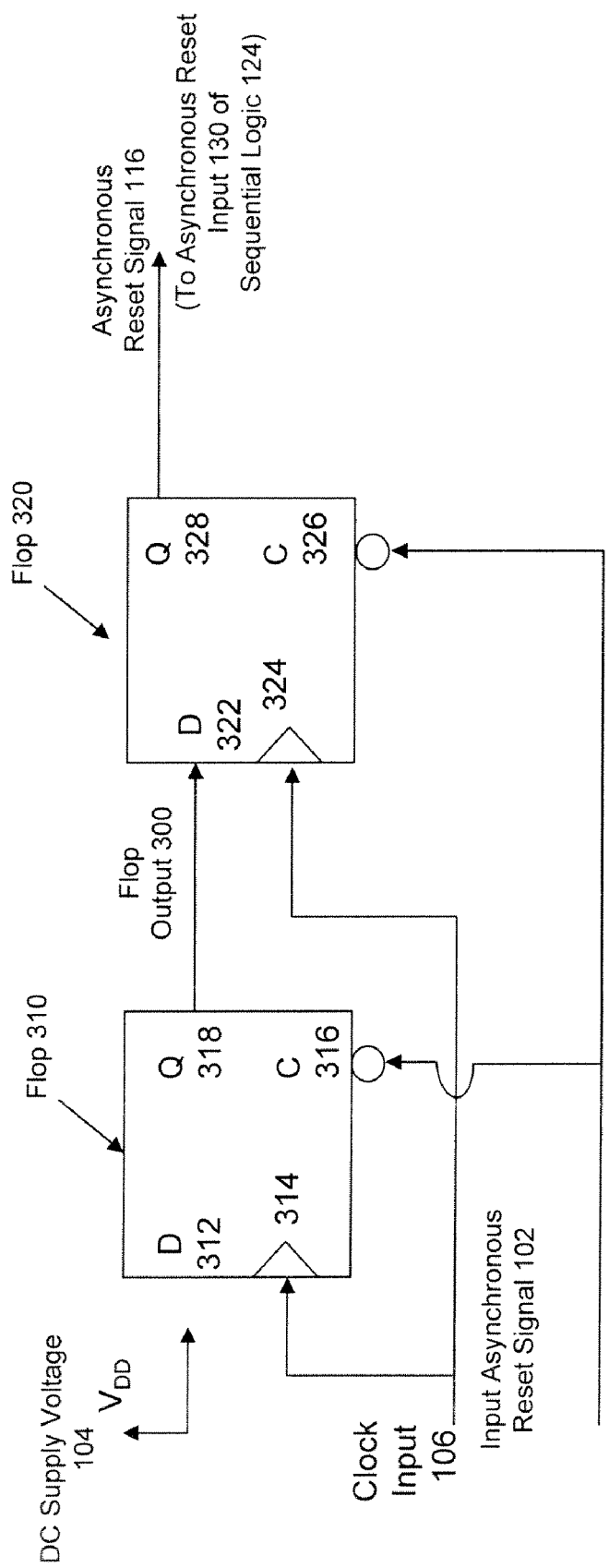
FIG. 3 illustrates a schematic of a circuit enabling the asynchronous activation and the synchronous release of an asynchronous reset signal, in accordance with prior art.
Figure 6:
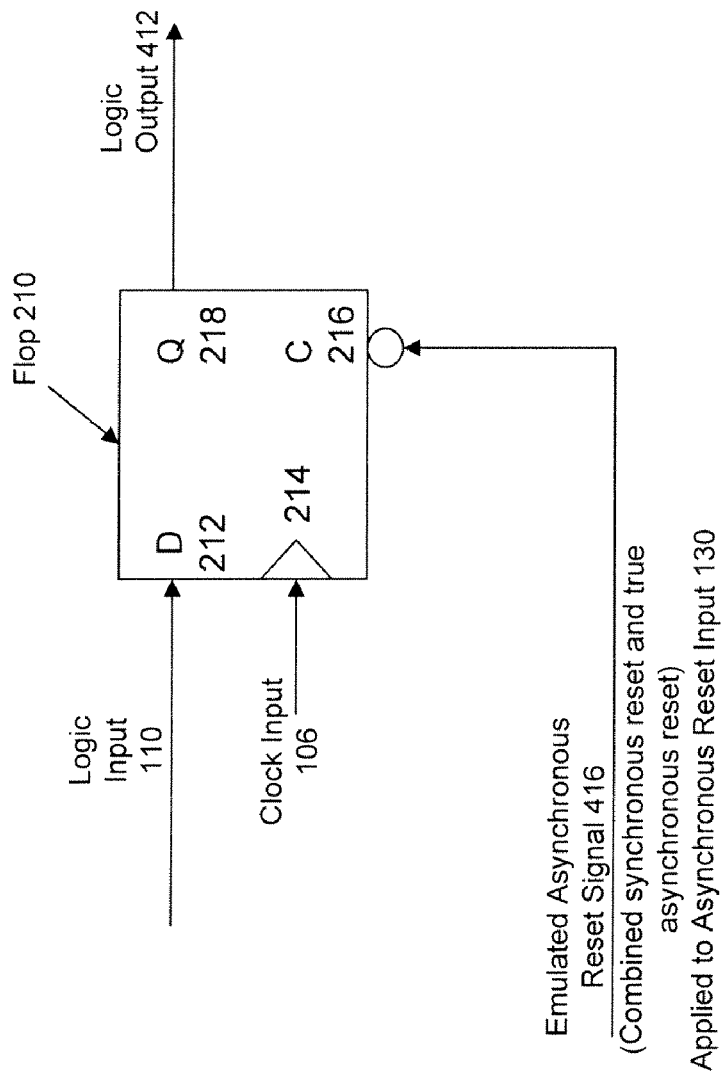
FIG. 6 illustrates a schematic of a circuit enabling synchronous and asynchronous reset of a sequential logic element, in accordance with one embodiment of the present invention.

FIG. 6 illustrates a schematic of a circuit enabling synchronous and asynchronous reset of a sequential logic element, in accordance with one embodiment of the present invention. This circuit is an implementation of the sequential logic 424 in FIG. 4. Flop 210 sees the logic input signal 110 from the processing logic 120 on its D-pin 212, the clock input 106 on its clock pin 214, and the emulated asynchronous reset signal 416, which is active low, on its C-pin 216. The emulated asynchronous reset signal 416 is applied to the asynchronous reset input 130 of the sequential logic 424 in FIG. 4. The logic output signal 412 of the sequential logic 424 is on Q-pin 218 of the flop 210. When the emulated asynchronous reset signal 416 is activated, the logic output signal 412 is set to the logic input signal 110. When the emulated asynchronous reset signal 416 is released, the logic output signal 412 retains its value independent of the value of the logic input signal 110 until the emulated asynchronous reset signal 416 is again activated. Since the emulated asynchronous reset signal 416 applied to the C-pin 216 of the flop 210 combines the synchronous reset and asynchronous reset functions, the mux 204 in FIG. 2 is not needed to enable synchronous reset of the flop 210.

Figure 7:
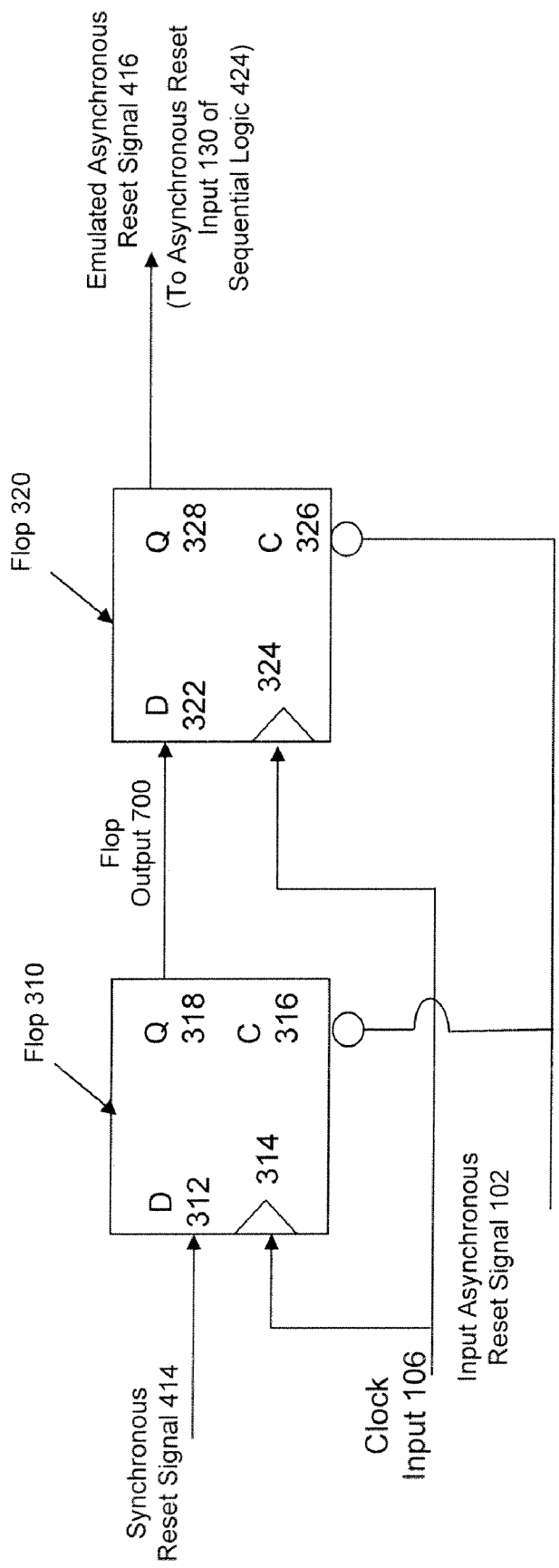
FIG. 7 illustrates a schematic of a circuit enabling the asynchronous activation and the synchronous release of an input asynchronous reset signal, in accordance with one embodiment of the present invention.

FIG. 7 illustrates a schematic of a circuit combining the input synchronous reset signal 414 and the input asynchronous reset signal 102, in accordance with one embodiment of the present invention. The circuit is an implementation of the asynchronous reset emulation logic 502 in FIG. 5. The circuit enables the asynchronous activation and the synchronous release of the input asynchronous reset signal 102, and the synchronous activation and release of the synchronous reset signal 414. Flop 310 sees the synchronous reset signal 414 on its D-pin 312, the clock input 106 on its clock pin 314, and the input asynchronous reset signal 102, which is active low, on its C-pin 316. Flop output signal 700 of the flop 310 is on its Q-pin 318. Flop 320 sees the flop output signal 700 of the flop 310 on its D-pin 322, the clock input 106 on its clock pin 324, and the input asynchronous reset signal 102, which is active low, on its C-pin 326. The output of the flop 320 is the emulated asynchronous reset signal 416.

The asynchronous activation of the input asynchronous reset signal 102, resulting in the activation of the emulated asynchronous reset signal 416, is essentially immediate. The emulated asynchronous reset signal 416 may already be active as a result of an active synchronous reset signal 414, in which case there is no change in the emulated asynchronous reset signal 416 resulting from activation of the input asynchronous reset signal 102. The synchronous activation of the synchronous reset signal 414, resulting in the activation of the emulated asynchronous reset signal 416, is synchronous, typically on a rising clock edge, assuming that the input asynchronous reset signal 102 is not active. The asynchronous reset emulation logic 502 shown in FIG. 7 guarantees that, upon the activation of the synchronous reset signal 414, the emulated asynchronous reset signal 416 does not activate (corresponding to passing the active synchronous reset signal 414 through the flop 310 and the flop 320) until the second subsequent rising edge of the clock input 106. This typically provides sufficient time for the logic in the system 150 to clear. If more time is required, additional flop states can be added to the reset logic 426. The release of the synchronous reset signal 414 and the input asynchronous reset signal 102 is also synchronous, and does not occur until the second subsequent rising edge of the clock input 106.

Figure 8:
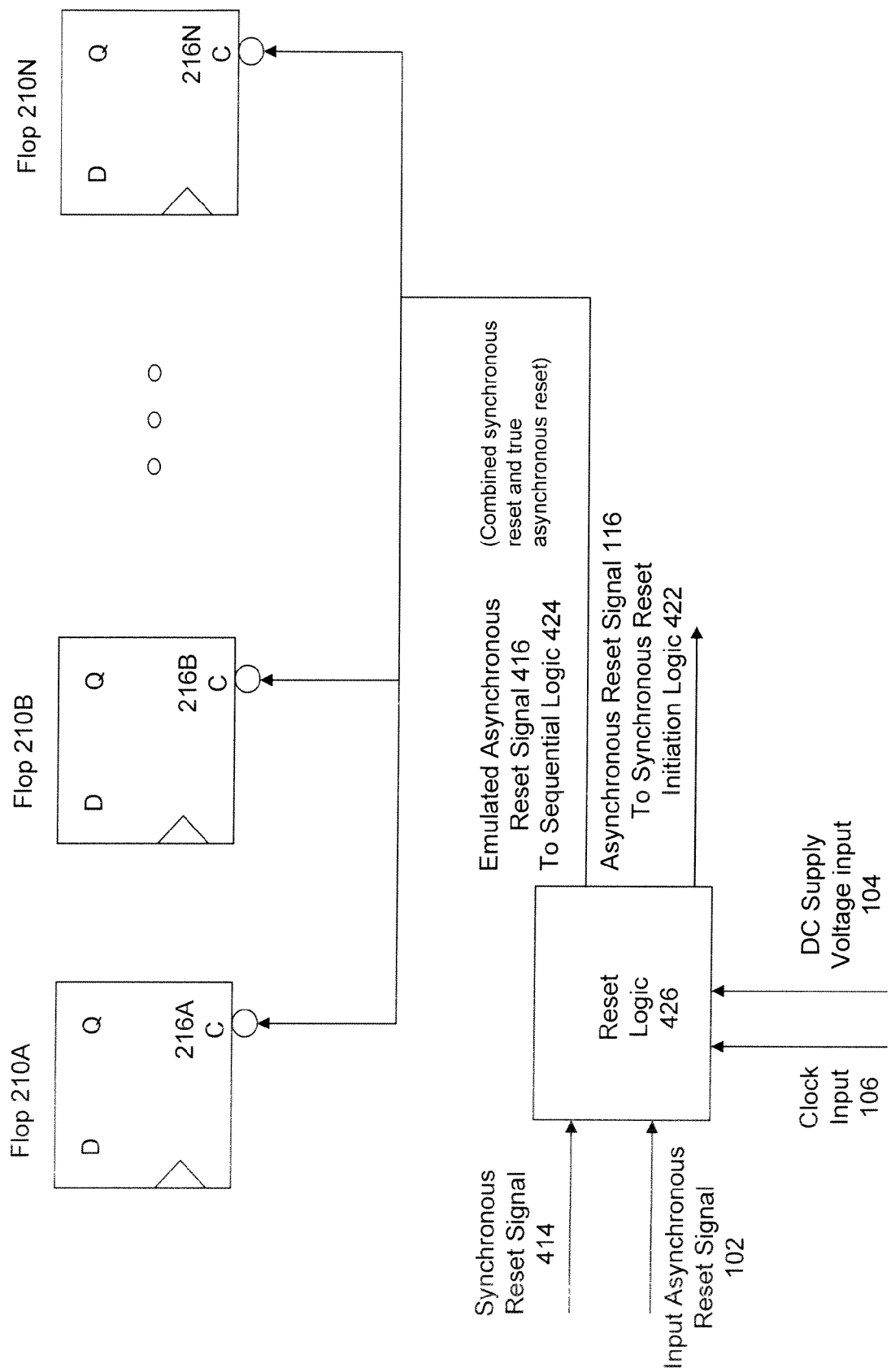
FIG. 8 illustrates a logical block diagram of a circuit enabling synchronous and asynchronous reset of multiple sequential logic elements using a single emulated asynchronous reset signal, in accordance with one embodiment of the present invention.

One benefit of the present invention is that it may be used to reduce the total number of logic elements required to reset a sequential logic circuit. As previously described, sequential logic 424 may comprise a number of individual sequential logic elements, such as flops 210-A to 210-N in FIG. 8. In particular, the emulated asynchronous reset 416 in FIG. 4 reduces the number of logic elements per flop 210 by the two gates used to implement the mux 204 in FIG. 2. As an illustrative example, for the integer number N of flops 210 in FIG. 8, the reduction in the total number of logic elements increases to 2×N (2 multiplied by N). On the other hand, the additional asynchronous reset emulation logic 502 in the reset logic 426 in FIG. 5 is not present in the prior art. The asynchronous reset emulation logic 502 typically has two flops, as shown in FIG. 7. Ten gates are used to implement each flop, or twenty gates for the implementation shown in FIG. 7. Therefore, in this example the number of gates in system 450 actually increases if there are fewer than ten sequential logic elements 210 in sequential logic 424 that are reset using the emulated asynchronous reset 416 in FIG. 4, and decreases if there are more than ten sequential logic elements 424 that are reset using the emulated asynchronous reset 416. The key point is that a reduction in the total number of gates in system 450 occurs only above some minimum number of individual sequential logic elements 424 that are reset using the emulated asynchronous reset 416. However, many sequential logic circuits do contain far more than this minimum number of sequential logic elements needed for this invention to reduce the total number of logic elements in these circuits.

A representative application is wireless local area networks (WLAN), such as those defined by the IEEE 802.11b standard. The input control signal 118 in FIG. 4 is typically generated by the processing logic 120 upon completion of a processing task. In the WLAN application, this processing task is the processing of an input packet. Since there is no state information that needs to be preserved from one input packet to the next input packet, the sequential logic 424 in FIG. 4 can be reset at the same time by the reset logic 426, as a result of the input control signal 118. In the normal operation of the WLAN embodiment of the system 450, the reset of the sequential logic 424 typically results from the completion of processing of an input packet, rather than an input asynchronous reset.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

What is claimed is:

1. An integrated circuit, comprising:

sequential logic including at least one asynchronous reset input;

processing logic storing state information in the sequential logic, the processing logic generating a control signal to initiate a synchronous reset of the sequential logic;

synchronous reset initiation logic receiving the control signal from said processing logic, said synchronous reset initiation logic in response generating a synchronous reset signal;

reset logic receiving said synchronous reset signal and an input asynchronous reset signal, said reset logic configured to generate a single signal coupled to said at least one asynchronous reset input of said sequential logic, said single signal resetting said sequential logic both synchronously and asynchronously;

wherein said synchronous reset initiation logic receives an asynchronous reset signal from said reset logic.

2. The integrated circuit of claim 1, wherein said sequential logic comprises a plurality of sequential logic elements, each of said plurality of sequential logic elements being reset both synchronously and asynchronously by said single signal.

3. The integrated circuit of claim 1, wherein a synchronous reset is synchronized with a clock edge.

4. The integrated circuit of claim 1, wherein said reset logic comprises:

asynchronous reset emulation logic receiving said synchronous reset signal and said input asynchronous reset signal, said asynchronous reset emulation logic in response generating said single signal; and asynchronous reset logic receiving said input asynchronous reset signal, said asynchronous reset logic in response generating an asynchronous reset signal for reset of said synchronous reset initiation logic.

5. The integrated circuit of claim 4, wherein said asynchronous reset emulation logic comprises:

a first sequential logic element generating a first output based on a clock signal, said input asynchronous reset signal, and said synchronous reset signal;

a second sequential logic element generating a second output based on said clock signal and said input asynchronous reset signal; and said asynchronous reset logic comprising:

a third sequential logic element generating a third output based on said first output, said clock signal, and said input asynchronous reset signal; and a fourth sequential logic element generating a fourth output based on said second output, said clock signal, and said input asynchronous reset signal.

6. The integrated circuit of claim 4, wherein said asynchronous reset emulation logic comprises:

a first flip-flop generating a first output based on a clock signal, said input asynchronous reset signal, and said synchronous reset signal; and a second flip-flop generating a second output based on said clock signal and said input asynchronous reset signal; and said asynchronous reset logic comprising:

a third flip-flop generating a third output based on said first output, said clock signal, and said input asynchronous reset signal; and a fourth flip-flop generating a fourth output based on said second output, said clock signal, and said input asynchronous reset signal.

* * * * *